US007262653B2

(12) United States Patent
Park et al.

(10) Patent No.: US 7,262,653 B2
(45) Date of Patent: Aug. 28, 2007

(54) VOLTAGE LEVEL DETECTION CIRCUIT

(75) Inventors: Sang Il Park, Icheon-shi (KR); Ja Seung Gou, Goyang-Si (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 14 days.

(21) Appl. No.: 11/275,463

(22) Filed: Jan. 6, 2006

(65) Prior Publication Data
US 2006/0220690 A1    Oct. 5, 2006

(30) Foreign Application Priority Data
Mar. 29, 2005   (KR) .................... 10-2005-00026151

(51) Int. Cl.
G05F 1/10          (2006.01)
(52) U.S. Cl. .................... 327/541; 327/87; 327/543
(58) Field of Classification Search .............. None
See application file for complete search history.

(56) References Cited

U.S. PATENT DOCUMENTS

| 4,973,962 | A | | 11/1990 | Shimizu |
| 5,283,762 | A | * | 2/1994 | Fujishima .............. 365/189.09 |
| 6,008,674 | A | * | 12/1999 | Wada et al. .................. 327/89 |
| 6,108,284 | A | | 8/2000 | Lee |
| 6,313,670 | B1 | * | 11/2001 | Song et al. .................. 327/108 |
| 6,531,914 | B2 | * | 3/2003 | Kawakubo .................. 327/541 |
| 6,861,895 | B1 | * | 3/2005 | Liu et al. .................... 327/536 |
| 7,038,498 | B2 | * | 5/2006 | Funaba ........................ 327/77 |
| 7,071,768 | B2 | * | 7/2006 | Abe et al. .................... 327/540 |
| 7,106,107 | B2 | * | 9/2006 | Bhattacharya et al. ........ 327/77 |

* cited by examiner

*Primary Examiner*—Tuan T. Lam
*Assistant Examiner*—William Hernandez
(74) *Attorney, Agent, or Firm*—Marshall, Gerstein & Borun LLP

(57) ABSTRACT

A voltage level detection circuit is disclosed. The voltage level detection circuit comprises a pull-up unit including a plurality of pull-up devices, each for supplying an internal voltage in response to a signal resulting from a logic operation of a voltage up control signal and a voltage down control signal, a voltage division unit including a plurality of voltage dividers, each for dividing the internal voltage from a corresponding one of the pull-up device, a switching unit including a plurality of switching devices, each for switching and supplying an output voltage from a corresponding one of the voltage dividers to an output node in response to a signal resulting from a logic operation of the voltage up control signal and voltage down control signal, and a comparator for comparing the voltage at the output node with a predetermined reference voltage and outputting a voltage pumping enable signal according to a result of the comparison.

7 Claims, 2 Drawing Sheets

VOLTAGE LEVEL DETECTION CIRCUIT

FIELD OF THE INVENTION

This patent relates to a voltage level detection circuit, and more particularly to a voltage level detection circuit for detecting the level of an internal voltage fed back from a voltage pump and generating a voltage pumping enable signal based on the detected level, and raising or lowering the internal voltage for a voltage level-based fault analysis at a packaging step of a semiconductor device.

DESCRIPTION OF THE RELATED ART

Generally, a semiconductor device, such as a dynamic random access memory (DRAM), includes a voltage pumping circuit for pumping and supplying an internal voltage such as a high voltage or back bias voltage. A voltage level detection circuit is provided in the voltage pumping circuit to detect the level of the pumped voltage and generate a voltage pumping enable signal based on the detected level to maintain the level of the internal voltage constantly.

The operation of a conventional voltage level detection circuit will hereinafter be described with reference to FIG. 1, which shows the configuration of the conventional voltage level detection circuit.

As shown in FIG. 1, the voltage level detection circuit, denoted by the reference numeral 100, includes a circuit configuration for detecting the level of an internal voltage VINT fed back from a voltage pump 120 and generating a voltage pumping enable signal ppe based on the detected level. The voltage level detection circuit 100 further includes a circuit configuration for performing a fault analysis through a characteristic analysis based on rising and falling of the internal voltage VINT at a packaging step of a semiconductor device.

First, a description will be given of the operation of the voltage level detection circuit 100 in the case where the internal voltage VINT has a normal level Vnom. In a normal mode where the internal voltage VINT has the normal level Vnom, a voltage up control signal v_up and a voltage down control signal v_down are inputted to the voltage level detection circuit 100 under the condition that both of them are disabled low in level. As a result, both an NMOS transistor N11 and an NMOS transistor N12 are turned off, whereas an NMOS transistor N13 is turned on because it receives a high-level signal from a NOR gate NR10 at its gate. Hence, a voltage obtained by dividing the internal voltage VINT by resistors R15 and R13 is applied to a node A.

Then, a comparator 110 compares the voltage at the node A with a predetermined reference voltage VREF and outputs a high-level signal when the voltage at the node A is lower than the reference voltage VREF. Accordingly, the voltage pumping enable signal ppe, outputted from an inverter IV10, is enabled low in level and the voltage pump 120 is thus enabled by the voltage pumping enable signal ppe to perform a pumping operation to raise the internal voltage VINT.

On the other hand, when the voltage at the node A is higher than the reference voltage VREF, the comparator 110 outputs a low-level signal. As a result, the voltage pumping enable signal ppe from the inverter IV10 is disabled high in level and the voltage pump 120 is thus disabled by the voltage pumping enable signal ppe to stop the pumping operation, thereby causing the internal voltage VINT to fall. By repeating this operation, the voltage level detection circuit 100 maintains the internal voltage VINT from the voltage pump 120 at the normal level Vnom.

Next, in a voltage up mode where the internal voltage VINT has a level VUP higher than the normal level Vnom, the voltage up control signal v_up is enabled high in level, whereas the voltage down control signal v_down is disabled low in level. As a result, both the NMOS transistor N12 and NMOS transistor N13 are turned off, whereas the NMOS transistor N11 is turned on because it receives the high-level signal at its gate. Thus, a voltage obtained by dividing the internal voltage VINT by the resistor R15 and a resistor R11 is applied to the node A.

Then, the comparator 110 and the voltage pump 120 cooperate to output the internal voltage VINT of the desired level VUP in the same manner as in the normal mode. Here, the resistor R11 is designed to have a resistance smaller than that of the resistor R13, and the voltage at the node A has the same level as that of the reference voltage VREF similarly to that in the normal mode. In this regard, for maintenance of the voltage at the node A at the level of the reference voltage VREF similarly to that in the normal mode, the internal voltage VINT from the voltage pump 120 rises above that in the normal mode. Consequently, in the voltage up mode, the internal voltage VINT is maintained at the level VUP higher than the normal level Vnom.

Finally, in a voltage down mode where the internal voltage VINT has a level VDN lower than the normal level Vnom, the voltage down control signal v_down is enabled high in level, whereas the voltage up control signal v_up is disabled low in level. As a result, both the NMOS transistor N11 and NMOS transistor N13 are turned off, whereas the NMOS transistor N12 is turned on because it receives the high-level signal at its gate. Thus, a voltage obtained by dividing the internal voltage VINT by the resistor R15 and a resistor R12 is applied to the node A.

Then, the comparator 110 and the voltage pump 120 cooperate to output the internal voltage VINT of the desired level VDN in the same manner as in the normal mode. Here, the resistor R12 is designed to have a resistance larger than that of the resistor R13, and the voltage at the node A has the same level as that of the reference voltage VREF similarly to that in the normal mode. In this regard, for maintenance of the voltage at the node A at the level of the reference voltage VREF similarly to that in the normal mode, the internal voltage VINT from the voltage pump 120 falls below that in the normal mode. Consequently, in the voltage down mode, the internal voltage VINT is maintained at the level VDN lower than the normal level Vnom.

Notably, the conventional voltage level detection circuit, operated in the above manner, level-changes and supplies the internal voltage according to the normal mode, voltage up mode and voltage down mode for a voltage level-based fault analysis at the packaging step of the semiconductor device. At this time, however, the internal voltage may be unstable because of being greatly influenced by variations in conditions such as a process, voltage and temperature.

That is, in order to supply a stable internal voltage according to each operation mode, it is necessary to stabilize an impedance at the node A toward a ground terminal. However, in the conventional voltage level detection circuit, as shown in FIG. 1, the three resistors, the resistor R11, resistor R12 and resistor R13, are connected in common to the node A and only one thereof is related to the actual operation. For this reason, the voltage at the node A may become higher or lower than a desired level due to leakage current flowing through the remaining two resistors which must not be related to the actual operation, a process variation, a temperature variation, etc. As a result, the voltage pumping enable signal ppe may be erroneously enabled or disabled, thereby making it impossible to maintain the internal voltage VINT from the voltage pump 120 at a constant level, thus making the internal voltage VINT unstable.

In addition, the internal voltage must be controlled to have the same level for every sample in the voltage up mode and voltage down mode for the fault analysis at the packaging step. However, in the conventional voltage level detection circuit, because the three resistors, the resistor R11, resistor R12 and resistor R13, are connected in common to the node A, the internal voltage is greatly influenced by a process variation, thereby making it difficult to generate the internal voltage of the same level for every sample.

SUMMARY OF THE INVENTION

A voltage level detection circuit which is capable of detecting the level of an internal voltage fed back from a voltage pump and generating a voltage pumping enable signal based on the detected level, and making the internal voltage stable and constant without being greatly influenced by variations in conditions such as a process, voltage and temperature, when raising or lowering the internal voltage for a voltage level-based fault analysis at a packaging step of a semiconductor device.

A voltage level detection circuit may include a pull-up unit including a plurality of pull-up means, each of the pull-up means supplying an internal voltage in response to a signal resulting from a logic operation of a voltage up control signal and a voltage down control signal; a voltage division unit including a plurality of voltage dividers, each of the voltage dividers dividing the internal voltage from a corresponding one of the pull-up means; a switching unit including a plurality of switching means, each of the switching means switching and supplying an output voltage from a corresponding one of the voltage dividers to an output node in response to a signal resulting from a logic operation of the voltage up control signal and voltage down control signal; and a comparator for comparing the voltage at the output node with a predetermined reference voltage and outputting a voltage pumping enable signal according to a result of the comparison.

Preferably, the plurality of pull-up means include: a first pull-up means operated when the voltage up control signal is enabled; a second pull-up means operated when the voltage down control signal is enabled; and a third pull-up means operated when the voltage up control signal and the voltage down control signal are disabled.

The first pull-up means may be a first PMOS transistor which is operated in response to an inverted signal of the voltage up control signal, the second pull-up means may be a second PMOS transistor which is operated in response to an inverted signal of the voltage down control signal, and the third pull-up means may be a third PMOS transistor which is operated in response to a signal resulting from an OR operation of the voltage up control signal and voltage down control signal.

Preferably, the plurality of voltage dividers include: a first voltage divider for dividing the internal voltage from the first pull-up means; a second voltage divider for dividing the internal voltage from the second pull-up means; and a third voltage divider for dividing the internal voltage from the third pull-up means. Here, the ratio of the internal voltage to the output voltage from each of the voltage dividers may be higher in the order of the second voltage divider, third voltage divider and first voltage divider.

Preferably, the plurality of switching means include: a first switching means operated when the voltage up control signal is enabled; a second switching means operated when the voltage down control signal is enabled; and a third switching means operated when the voltage up control signal and the voltage down control signal are disabled.

The first switching means may be a first NMOS transistor which is operated in response to the voltage up control signal, the second switching means may be a second NMOS transistor which is operated in response to the voltage down control signal, and the third switching means may be a third NMOS transistor which is operated in response to a signal resulting from a NOR operation of the voltage up control signal and voltage down control signal.

The voltage pumping enable signal may be enabled when the voltage at the output node is lower than the reference voltage.

BRIEF DESCRIPTION OF THE DRAWINGS

Features and advantages of the present invention will be more clearly understood from the following detailed description taken in conjunction with the accompanying drawings, in which.

DESCRIPTION OF THE PREFERRED EMBODIMENTS

Figure 1:
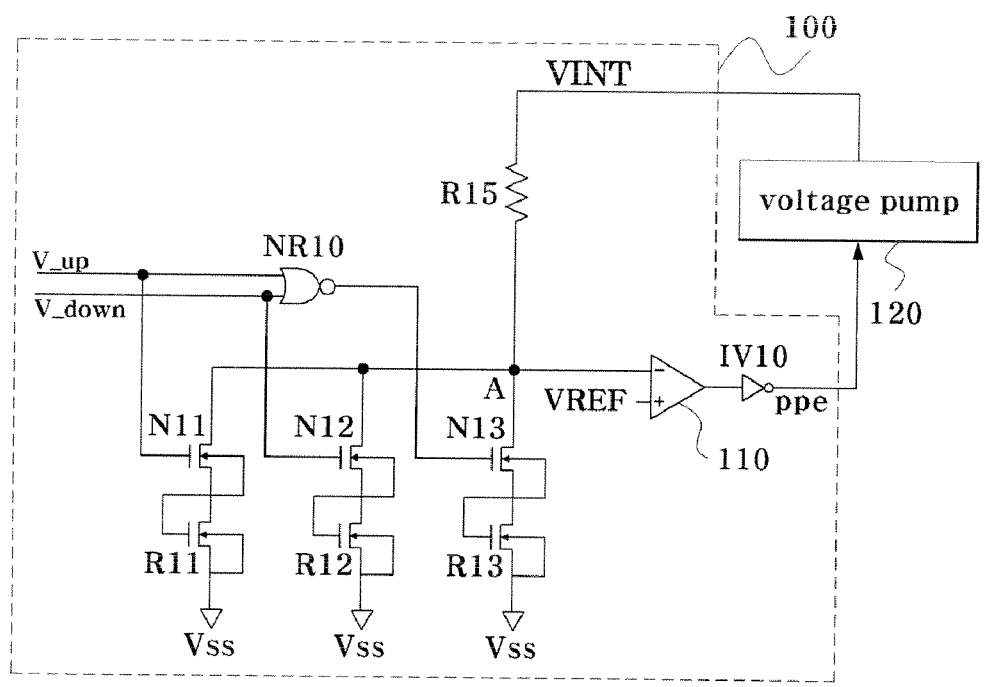
FIG. 1 is a circuit diagram showing the configuration of a conventional voltage level detection circuit.

Reference will now be made in detail to the preferred embodiments of the present invention, examples of which are illustrated in the accompanying drawings, wherein like reference numerals refer to like elements throughout. The embodiments are described below to explain the present invention by referring to the figures.

The present invention will hereinafter be described with reference to FIG. 2, which shows the configuration of a voltage level detection circuit according to an exemplary embodiment of the present invention.

Figure 2:
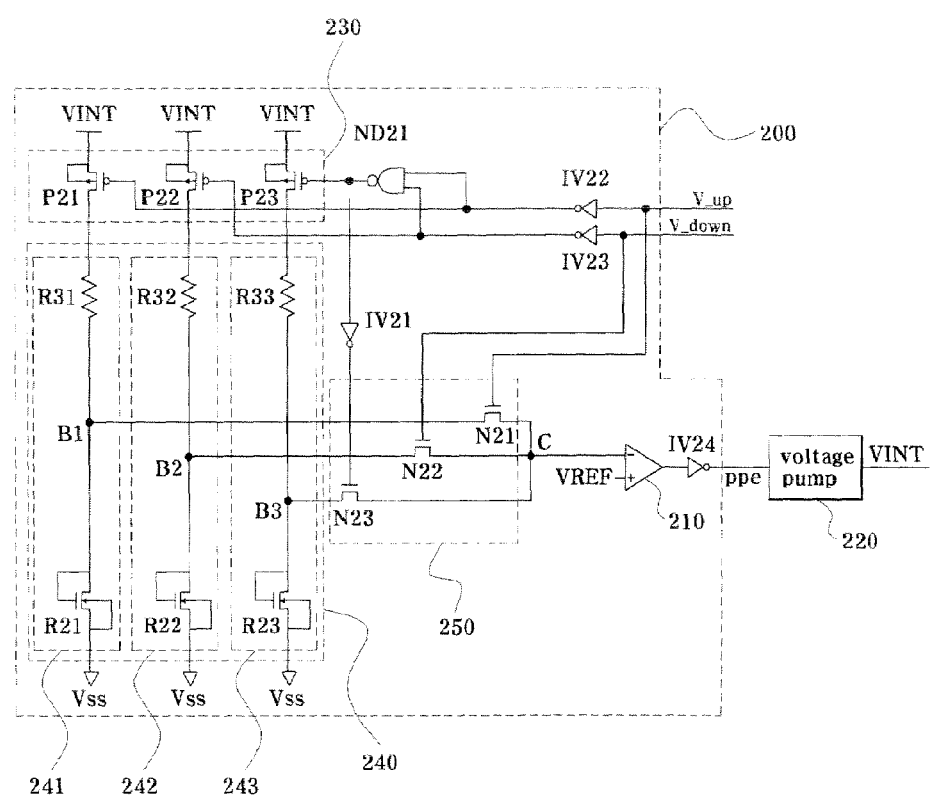
FIG. 2 is a circuit diagram showing the configuration of a voltage level detection circuit according to an exemplary embodiment of the present invention.

As shown in FIG. 2, the voltage level detection circuit according to the present embodiment comprises a pull-up unit 230 including a plurality of pull-up means, or a PMOS transistor P21, PMOS transistor P22 and PMOS transistor P23, each for supplying an internal voltage VINT in response to a signal resulting from a logic operation of a voltage up control signal v_up and a voltage down control signal v_down, and a voltage division unit 240 including a plurality of voltage dividers 241, 242 and 243, each for dividing the internal voltage VINT from a corresponding one of the pull-up means, or the PMOS transistor P21, PMOS transistor P22 and PMOS transistor P23. The voltage level detection circuit further comprises a switching unit 250 including a plurality of switching means, or an NMOS transistor N21, NMOS transistor N22 and NMOS transistor N23, each for switching and supplying an output voltage from a corresponding one of the voltage dividers 241, 242 and 243 to a node C in response to a signal resulting from a logic operation of the voltage up control signal v_up and voltage down control signal v_down, and a comparator 210 for comparing the voltage at the node C with a predetermined reference voltage VREF and outputting a voltage pumping enable signal ppe according to the comparison result.

The operation of the voltage level detection circuit with the above-stated configuration according to the present embodiment will hereinafter be described in detail with reference to FIG. 2.

As shown in FIG. 2, the voltage level detection circuit, denoted by the reference numeral 200, includes a circuit configuration for detecting the level of the internal voltage VINT, fed back from a voltage pump 220, and generating the voltage pumping enable signal ppe based on the detected level. The voltage level detection circuit 200 further includes a circuit configuration for performing a fault analysis through a characteristic analysis based on rising and falling of the internal voltage VINT at a packaging step of a semiconductor device. The operation of the present embodiment will hereinafter be described in conjunction with respective operation modes, a normal mode, voltage up mode and voltage down mode.

First, a description will be given of the operation of the voltage level detection circuit 200 in the normal mode. In the normal mode where the internal voltage VINT has a normal level Vnom, the voltage up control signal v_up and the voltage down control signal v_down are inputted to the voltage level detection circuit 200 under the condition that both of them are disabled low in level. As a result, both a PMOS transistor P21 and a PMOS transistor P22 are turned off, whereas a PMOS transistor P23 is turned on because it receives a low-level signal from a NAND gate ND21 at its gate. Hence, a voltage obtained by dividing the internal voltage VINT by resistors R33 and R23 is applied to a node B3. Here, the signal inputted to the gate of the PMOS transistor P23 is the same as a signal resulting from an OR operation of the voltage up control signal v_up and the voltage down control signal v_down.

Meanwhile, in the switching unit 250, both an NMOS transistor N21 and an NMOS transistor N22 are turned off, whereas an NMOS transistor N23 is turned on because it receives a high-level signal from an inverter IV21 at its gate. As a result, the voltage at the node B3 is supplied to the node C through the NMOS transistor N23. Here, the signal inputted to the gate of the NMOS transistor N23 is the same as a signal resulting from a NOR operation of the voltage up control signal v_up and the voltage down control signal v_down.

Then, the comparator 210 compares the voltage at the node C with the predetermined reference voltage VREF and outputs a high-level signal when the voltage at the node C is lower than the reference voltage VREF. As a result, the voltage pumping enable signal ppe, outputted from an inverter IV24, is enabled low in level and the voltage pump 220 is thus enabled by the voltage pumping enable signal ppe to perform a pumping operation to raise the internal voltage VINT.

On the other hand, when the voltage at the node C is higher than the reference voltage VREF, the comparator 210 outputs a low-level signal. Hence, the voltage pumping enable signal ppe from the inverter IV24 is disabled high in level and the voltage pump 220 is thus disabled by the voltage pumping enable signal ppe to stop the pumping operation, thereby causing the internal voltage VINT to fall. By repeating this operation, the voltage level detection circuit 200 maintains the internal voltage VINT from the voltage pump 220 at the normal level Vnom.

Next, in the voltage up mode where the internal voltage VINT has a level VUP higher than the normal level Vnom, the voltage up control signal v_up is enabled high in level, whereas the voltage down control signal v_down is disabled low in level. Accordingly, both the PMOS transistor P22 and PMOS transistor P23 are turned off because they receive high-level signals at their gates, whereas the PMOS transistor P21 is turned on because it receives a low-level signal at its gate. Thus, a voltage obtained by dividing the internal voltage VINT by a resistor R31 and a resistor R21 is applied to a node B1.

Meanwhile, in the switching unit 250, both the NMOS transistor N22 and NMOS transistor N23 are turned off because they receive low-level signals at their gates, whereas the NMOS transistor N21 is turned on because it receives a high-level signal at its gate. As a result, the voltage at the node B1 is supplied to the node C through the NMOS transistor N21.

Then, the comparator 210 and the voltage pump 220 cooperate to output the internal voltage VINT of the desired level VUP in the same manner as in the normal mode.

It should be noted here that the voltage division ratio of the resistor R31 and resistor R21 is set to be different from that of the resistor R33 and resistor R23. In other words, because the ratio of the supplied internal voltage to the voltage at the node B1 in the voltage divider 241 is set to be lower than the ratio of the supplied internal voltage to the voltage at the node B3 in the voltage divider 243, the internal voltage drops in the voltage divider 241 more than in the voltage divider 243. In this case, the voltage at the node C has the same level as that of the reference voltage VREF similarly to that in the normal mode. In this connection, for maintenance of the voltage at the node C at the level of the reference voltage VREF similarly to that in the normal mode, the internal voltage VINT which is supplied from the voltage pump 220 to the PMOS transistor P21 rises to the level VUP higher than the normal level Vnom of the internal voltage VINT which is supplied from the voltage pump 220 to the PMOS transistor P23 in the normal mode. Consequently, in the voltage up mode, the internal voltage VINT is maintained at the level VUP higher than the normal level Vnom.

Finally, in the voltage down mode where the internal voltage VINT has a level VDN lower than the normal level Vnom, the voltage down control signal v_down is enabled high in level, whereas the voltage up control signal v_up is disabled low in level. As a result, both the PMOS transistor P21 and PMOS transistor P23 are turned off because they receive high-level signals at their gates, whereas the PMOS transistor P22 is turned on because it receives a low-level signal at its gate. Thus, a voltage obtained by dividing the internal voltage VINT by a resistor R32 and a resistor R22 is applied to a node B2.

Meanwhile, in the switching unit 250, both the NMOS transistor N21 and NMOS transistor N23 are turned off because they receive low-level signals at their gates, whereas the NMOS transistor N22 is turned on because it receives a high-level signal at its gate. Accordingly, the voltage at the node B2 is supplied to the node C through the NMOS transistor N22.

Then, the comparator 210 and the voltage pump 220 cooperate to output the internal voltage VINT of the desired level VDN in the same manner as in the normal mode.

Notably, the voltage division ratio of the resistor R32 and resistor R22 is set to be different from that of the resistor R33 and resistor R23. That is, because the ratio of the supplied internal voltage to the voltage at the node B2 in the voltage divider 242 is set to be higher than the ratio of the supplied internal voltage to the voltage at the node B3 in the voltage divider 243, the internal voltage drops in the voltage divider 242 less than in the voltage divider 243. In this case, the voltage at the node C has the same level as that of the reference voltage VREF similarly to that in the normal mode. In this connection, for maintenance of the voltage at the node C at the level of the reference voltage VREF similarly to that in the normal mode, the internal voltage VINT which is supplied from the voltage pump 220 to the PMOS transistor P22 falls to the level VDN lower than the normal level Vnom of the internal voltage VINT which is supplied from the voltage pump 220 to the PMOS transistor P23 in the normal mode. Consequently, in the voltage down mode, the internal voltage VINT is maintained at the level VDN lower than the normal level Vnom.

As described above, the voltage level detection circuit according to the present embodiment can make the internal voltage stable and constant without being greatly influenced by variations in conditions such as a process, voltage and temperature, when raising or lowering the internal voltage for the voltage level-based fault analysis at the packaging step of the semiconductor device.

In other words, in the present embodiment, the pull-up means supplying the internal voltage VINT are provided independently for the respective operation modes. Therefore, in each operation mode, one pull-up means is turned on and the remaining pull-up means are turned off to completely cut off the associated voltage sources. In addition, in the present embodiment, the switching means, or the NMOS transistor N21, NMOS transistor N22 and NMOS transistor N23, are provided independently for the respective operation modes, so that the associated voltages are transferred to the node C under the condition that they are not influenced by the other resistors.

For example, in the voltage up mode, only the PMOS transistor P21 is turned on and the remaining PMOS transistors P22 and P23 are turned off, so as to thoroughly cut off the flow of current along no-operation current paths in the voltage up mode. As a result, the PMOS transistor P21 and voltage divider 241 operated in the voltage up mode are not influenced by the neighboring devices for the other operation modes. Accordingly, because the level of the voltage at the node C is determined by only the resistor R31 and resistor R21, it can be little influenced by external environmental variations (variations in conditions such as a process, temperature and voltage), thereby making it possible to raise the internal voltage to a constant level for every sample for analysis. This effect is similarly obtained in the normal mode and the voltage down mode.

As apparent from the above description, the present invention provides a voltage level detection circuit which is capable of making an internal voltage stable and constant without being greatly influenced by variations in conditions such as a process, voltage and temperature, when raising or lowering the internal voltage for a voltage level-based fault analysis at a packaging step of a semiconductor device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims

What is claimed is:

1. A voltage level detection circuit comprising:
   a pull-up unit including a plurality of pull-up means, each of the pull-up means supplying an internal voltage in response to a signal resulting from a logic operation of a voltage up control signal and a voltage down control signal;
   a voltage division unit including a plurality of voltage dividers, each of the voltage dividers dividing the internal voltage from a corresponding one of the pull-up means;
   a switching unit including a plurality of switching means, each of the switching means switching and supplying an output voltage from a corresponding one of the voltage dividers to an output node in response to a signal resulting from a logic operation of the voltage up control signal and voltage down control signal; and
   a comparator for comparing the voltage at the output node with a predetermined reference voltage and outputting a voltage pumping enable signal according to a result of the comparison.

2. The voltage level detection circuit as set forth in claim 1, wherein the plurality of pull-up means include:
   a first pull-up means operated when the voltage up control signal is enabled;
   a second pull-up means operated when the voltage down control signal is enabled; and
   a third pull-up means operated when the voltage up control signal and the voltage down control signal are disabled.

3. The voltage level detection circuit as set forth in claim 2, wherein:
   the first pull-up means is a first PMOS transistor which is operated in response to an inverted signal of the voltage up control signal;
   the second pull-up means is a second PMOS transistor which is operated in response to an inverted signal of the voltage down control signal; and
   the third pull-up means is a third PMOS transistor which is operated in response to a signal resulting from an OR operation of the voltage up control signal and voltage down control signal.

4. The voltage level detection circuit as set forth in claim 2, wherein the plurality of voltage dividers include:
   a first voltage divider for dividing the internal voltage from the first pull-up means;
   a second voltage divider for dividing the internal voltage from the second pull-up means; and
   a third voltage divider for dividing the internal voltage from the third pull-up means,
   wherein a ratio of the internal voltage to the output voltage from each of the voltage dividers is higher in the order of the second voltage divider, third voltage divider and first voltage divider.

5. The voltage level detection circuit as set forth in claim 1, wherein the plurality of switching means include:
   a first switching means operated when the voltage up control signal is enabled;
   a second switching means operated when the voltage down control signal is enabled; and
   a third switching means operated when the voltage up control signal and the voltage down control signal are disabled.

6. The voltage level detection circuit as set forth in claim 5, wherein:

the first switching means is a first NMOS transistor which is operated in response to the voltage up control signal;

the second switching means is a second NMOS transistor which is operated in response to the voltage down control signal; and the third switching means is a third NMOS transistor which is operated in response to a signal resulting from a NOR operation of the voltage up control signal and voltage down control signal.

7. The voltage level detection circuit as set forth in claim 1, wherein the voltage pumping enable signal is enabled when the voltage at the output node is lower than the predetermined reference voltage.

* * * * *

UNITED STATES PATENT AND TRADEMARK OFFICE
CERTIFICATE OF CORRECTION

PATENT NO. : 7,262,653 B2  Page 1 of 1
APPLICATION NO. : 11/275463
DATED : August 28, 2007
INVENTOR(S) : Sang Il Park et al.

It is certified that error appears in the above-identified patent and that said Letters Patent is hereby corrected as shown below:

On The Title Page

Item -87- line 1, delete "A voltage level detection circuit is disclosed.".

Signed and Sealed this

Eighteenth Day of March, 2008

JON W. DUDAS
*Director of the United States Patent and Trademark Office*